United States Patent [19]

Streifer et al.

[11] 4,335,461

[45] Jun. 15, 1982

[54] INJECTION LASERS WITH LATERAL SPATIAL THICKNESS VARIATIONS (LSTV) IN THE ACTIVE LAYER

[75] Inventors: William Streifer, Palo Alto; Donald R. Scifres, Los Altos; Robert D. Burnham, Los Altos Hills, all of Calif.

[73] Assignee: Xerox Corporation, Stamford, Conn.

[21] Appl. No.: 181,262

[22] Filed: Aug. 25, 1980

[51] Int. Cl.$^3$ .............................................. H01S 3/19
[52] U.S. Cl. ...................................... 372/45; 357/17; 372/48
[58] Field of Search ................... 331/94.5 H; 357/17, 357/18

[56] References Cited

U.S. PATENT DOCUMENTS

| | | | |
|---|---|---|---|
| 3,978,428 | 8/1976 | Burnham et al. | 331/94.5 H |
| 4,249,142 | 2/1981 | Burnham et al. | 331/94.5 H |
| 4,251,298 | 2/1981 | Thompson | 331/94.5 H |

Primary Examiner—James W. Davie
Attorney, Agent, or Firm—W. Douglas Carothers, Jr.

[57] ABSTRACT

Enhanced higher order mode discrimination is obtained in injection lasers with lateral spatial thickness variations (LSTV) in the active layer with (1) the proper refractive index quantitative differences in the cladding layers contiguous with the active layer and (2) by fabricating the active layer to have a rapidity in its LSTV from the maximum thickness to the minimum thickness that is very gradual.

5 Claims, 8 Drawing Figures

INJECTION LASERS WITH LATERAL SPATIAL THICKNESS VARIATIONS (LSTV) IN THE ACTIVE LAYER

BACKGROUND OF THE INVENTION

This invention relates to solid state lasers and specifically such lasers that have a region in their active layer provided with a lateral spatial thickness variation (LSTV) in their active layers. Such spatial variations are also referred to as laterally tapered active regions in diode lasers.

One class of lasers incorporating such an active region are known as channelled substrate nonplanar lasers (CSNP), the term "nonplanar" denoting that the active layer possesses a nonplanar active region, which region is formed during fabrication of the laser. The nonplanar region is conventionally formed via liquid phase epitaxy (LPE), by growth of laser semiconductor layers over a channelled substrate. An example of such a laser is disclosed in U.S. Pat. No. 3,978,428. Such nonplanar laser structures may be fabricated in other ways, as will be discussed later.

Various studies have been made on the geometries and properties of LSTV type injection lasers.

Examples of such analyses are disclosed in "Channeled Substrate Buried Heterostructure GaAs-(GaAl)As Injection Lasers", P. A. Kirkby and G. H. B. Thompson *Journal of Applied Physics*, Vol. 47, No. 10, page 4578 et seq. (October, 1976) and "Channeled-Substrate Narrow-Stripe GaAs/GaAlAs Injection Lasers With Extremely Low Threshold Currents", P. A. Kirkby *Electronic Letters*, Vol. 15 No. 25 pages 824–826 (December, 1979).

The strong interest in these types of lasers is attributed to their good operating characteristics, such as, low threshold current, linear light versus current characteristic, good temperature performance, and relatively symmetrical, anastigmatic output beams.

A principal shortcoming of these devices, however, has been that LSTV laser will begin to lase simultaneously in the fundamental ($TE_{00}$) and first order ($TE_{01}$) and/or other higher order modes not far above their operating threshold. This condition is not accompanied by a distinctive kink in the optical output power versus current characteristic but nevertheless it is undesirable in laser applications that require highly focused output beams over a wide range of output power.

Model consideration of LSTV lasers is therefore highly desirable in order to achieve laser designs that operate at single fundamental transverse mode at elevated power output levels without the higher order transverse modes while simultaneously maintaining or improving other favorable geometric and operating characteristics. Such analysis includes studies and experiments involving property variations with parametric changes, such as, dependencies on layer thicknesses, layer compositions, layer thickness variations, laser length, current confinement with widths, spreading resistance, and carrier diffusion constants.

We have approached this problem from the standpoint of viewing these parametric changes from studies and experiments relating to the $TE_{00}$ mode power level at which the $TE_{01}$ mode attains threshold, which threshold is termed $P_1^*$.

SUMMARY OF THE INVENTION

According to this invention, greatly enhanced higher order mode discrimination can be obtained in a repeatable manner and providing high yield by (1) fabricating LSTV type injection lasers with the proper refractive index quantitative differences in the cladding layers contiguous with the active layer of the laser and (2) fabricating the active layer to have a rapidity in the lateral spatial thickness variation in the active layer that is slight or small as compared to LSTV lasers previously known in the art. Operating characteristics are further improved by also providing narrow current confinement and high spreading resistance.

One means of achieving a quantitative difference in the relative indices of the cladding layers is by compositional differences in semiconductor materials comprising these layers.

The lateral spatial thickness variation forming a nonplanar active region in the active layer may be characterized as a slight taper in layer thickness. One mathematical manner of defining such a characterization is that the rapidity of the thickness variation (taper) in conjunction with the ratio of the difference between maximum and minimum layer thicknesses relative to maximum layer thickness according to the symbols of equation (1) hereinafter referred to, i.e., $$\left[ \frac{t_2(0) - t_2(\infty)}{t_2(0)} \right] \gamma,$$

which is in the range of 0.01 to 0.05.

The LSTV laser according to this invention will produce a highly focused output beam (single mode) over a wide range of output beams suitable for write-/read applications in xerographic machines and optical disk recording systems.

Other objects and attainments together with a fuller understanding of the invention will become apparent and appreciated by referring to the following description and claims taken in conjunction with the accompanying drawings.

DESCRIPTION OF THE PREFERRED EMBODIMENT

Figure 1:
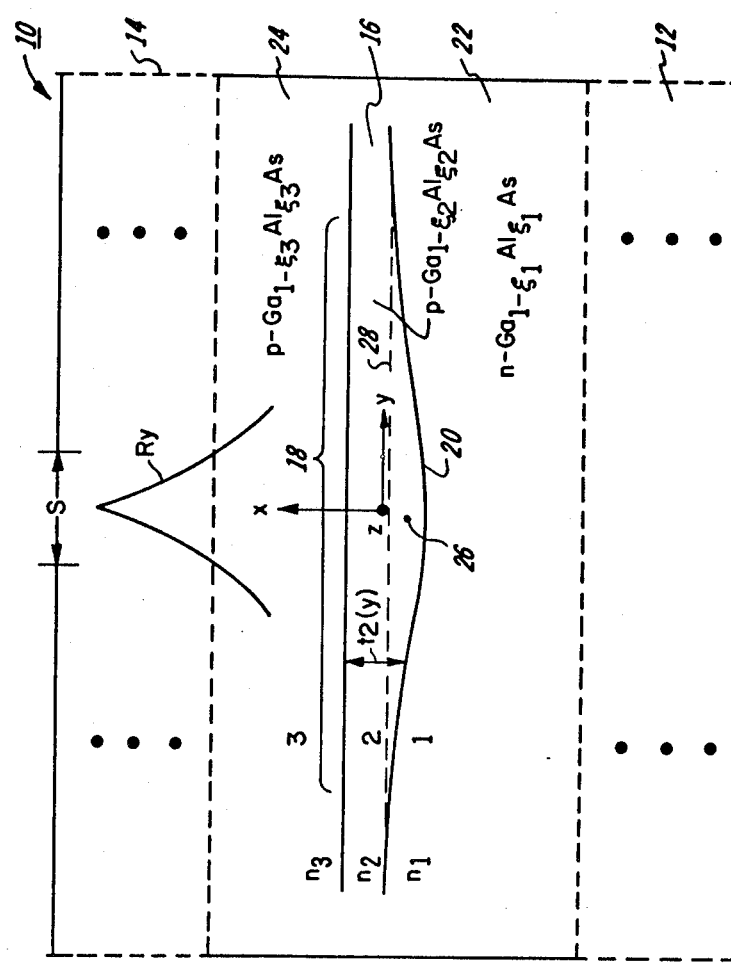
FIG. 1 is a schematic illustration of a model injection laser with a lateral spatial thickness variation in the active layer with continuous cladding layers having asymmetric compositional content.

FIG. 1 illustrates a model injection laser 10 which comprises a plurality of semiconductor layers. For illustration purposes, only three layers are shown. Other semiconductor layers for laser 10 may be conventional substrate or contact layers, waveguide layers, waveguide layers forming large optical cavities for the propagating optical wave, very low and extremely thin mode control layers, nonplanar layers, etc. In explanation of this invention, discussion of these layers is not necessary and, therefore, are illustrated in phantom at regions 12 and 14 in FIG. 1.

Model injection laser 10 includes active layer 16 having an active region 18 which varies in thickness, $t_2$, in the lateral direction y from a maximum thickness $t_2(0)$ to a minimum thickness at $t_2(\infty)$. Layer 16 is, therefore, nonplanar and may be characterized as having a taper at 20 for the full extent of the active region 18. For purposes of later explanation, layer 16 is also designated region 2 and is so marked in FIG. 1.

Active layer 16 is bounded on either surface with a cladding layer 22 and 24. Layer 22 is also designated as region 1 and layer 24 is also designated as region 3.

Cladding layers 22 and 24 have refractive indices $\eta_1$ and $\eta_3$, respectively, and active layer has a refractive index of $\eta_2$. As is well known, $\eta_2$ is greater than $\eta_1$ and $\eta_3$ so that carrier recombination occurs in active layer 16 due to the formation of a p-n junction between this layer and an adjacent cladding layer. The lasing action takes place in the optical waveguide cavity comprising the higher index active layer 16 bounded for mode guiding in the X direction by cladding layers 22 and 24, and wherein optical radiation is substantially confined and guided in region 18 of layer 16 and propagates in the Z direction perpendicular to facet surfaces providing optical feedback.

The desired differences in refractive indexes to provide for such waveguiding can be achieved by compositional differences in the materials comprising layers 16, 22 and 24. As an example, layer 22 may comprises n-Ga$_{1-\xi_1}$Al$_{\xi_1}$As, layer 16, p-Ga$_{1-\xi_2}$Al$_{\xi_2}$As and layer 24 p-Ga$_{1-\xi_3}$Al$_{\xi_3}$As and wherein $\xi_1$ and $\xi_3$ are greater than $\xi_2$. The active layer 16 may also be p-GaAspGaAs.

In FIG. 1 stripe width is denoted as s and spreading resistance is denoted as $R_y$. Any conventionally known means for providing current confinement may be provided with laser 10 and, therefore, the reference to contact stripe geometry is only for explicating purposes.

As previously indicated, the best example of a semiconductor injection laser with a nonplanar active region is the CSNP laser. LPE processing lends itself to growing tapered active regions 18 by means of initially forming an etched channel in the laser substrate. In the case here, the substrate would be n-GaAs. However, nonplanar variations 20 can also be created by metalorganic chemical vapor deposition (MO-CVD) and by molecular beam epitaxy (MBE). In MO-CVD, masking techniques may be employed to form region 26 on a previously epitaxial grown active layer 16 of uniform thickness and nonplanar for its full lateral extent. In such a case, there is no need for a channeled substrate. The substrate is flat.

In MBE, a mask with an elongated aperture may be employed. An oscillatory symmetrical motion is applied to the mask during epitaxial growth of the active layer in the MBE change. The oscillatory motion is in a direction normal to the length of the aperture. The amplitude of the oscillatory motion is a little less than one half of the width of the mask aperture. The central point of the period of oscillatory motion would always permit beam exposure through the mask aperture while exposure of other portions of areas of epitaxial growth would be exposed expotentially to lesser amounts of beam exposure. This exposure over a period of time would create a growth on a previously expitaxially deposited active layer having uniform lateral planar thickness and forming the region 26 as bounded by dotted line 28 and topper 20.

We have discovered that a very useful tool for optimizing the operating characteristics LSTV injection lasers is to approach injection laser modeling and fabrication from the standpoint of parametric variations while viewing the fundamental transverse mode power level at which the first order transverse mode attains threshold, which is denoted as P*. We have discovered that if the taper 20 of the active region 18, i.e., if the rapidity of decreasing active layer thicknesses, $t_1$, from a maximum value to a minimum value is provided to be small and within a desired range and that if the cladding layers are provided with different aluminum content to render them asymmetric so that one has a slightly lower index of refraction than the other, the higher order transverse modes are greatly discriminated against while the fundamental transverse mode is greatly favored for propagation. The optical power output and operating characteristics, mode discrimination is further improved by providing narrow current confinement. High spreading resistance, $R_1$, also imposes mode discrimination and lowers threshold current but not as significantly as narrow current confinement.

We have done previous analysis of injection lasers with LSTV based upon TE$_{00}$ mode threshold, as set forth in our article entitled "Analysis of Diode Lasers With Lateral Spatial Variations In Thickness", *Journal of Applied Physics Letters*, Vol. 37, No. 2, page 121 et seq. (July 15, 1980). However, that article does not take into account asymmetric compositional content of the cladding layers in combination with desired rapidity of the active region taper all with a view toward maximizing the power threshold, $P_1^*$, at which the first order mode, TE$_{00}$, lases, and generally optimizing parametric values in a relationship such that enhanced higher order mode discrimination is enhanced beyond that now known in the injection laser art.

The analysis and experimental results in support of this invention may be formulated as follows.

The diffusion equation employed in our previous analysis is reformulated to account for stimulated recombination to include the effects of lateral spatial hole burning. The analysis is performed in a self-consistent manner such that the diffusion equation, the modal wave equation, and the cavity condition are simultaneously satisfied. This technique is then applied to injection lasers whose active regions with a maximum thickness at the center $y=0$.

Calculations are made for the power vs. current characteristic, differential quantum efficiency $\eta_D$, mode patterns above threshold and $P_1^*$. Decreasing the stripe width, s, is found to produce a dramatic increase in $P_1^*$, as does increasing the aluminum asymmetry in cladding layers 22 and 24. Moreover, the mode patterns are essentially unchanged with pumping level and the power versus current characteristics deviate from linearity on the order of 0.5%. These computations compare well with experimental observations.

The active region lateral initial thickness variation (LSTV) may be represented by a Gaussian equation $$t_2(y) = t_2(0) - [t_2(0) - t_2(\infty)][1 - \exp(-\gamma y^2)], \quad (1)$$

where $\gamma$ is a parameter which determines the rapidity with which $t_2(y)$ decreases from $t_2(0)$ to $t_2(\infty)$. As a result of the diminishing thickness, the equivalent refractive index is a maximum at $y=0$. Therefore real refractive index waveguiding exists in the y-direction. Moreover, the modal power overlap with the active region 18, also known as the filling factor, $\Gamma(y)$, decreases with y. Finally, LSTV, $t_2(y)$, acts to produce a diffusion gradient that propels charges into the modal volume of region 18, and, thus, increases the differential quantum efficiency, $\eta_D$.

Our model injection laser 10 relative current flow with stripe width s and spreading resistance $R_y$ follows that set forth in an Article by H. Yonequ et al *Japan Journal of Applied Physics*, Vol. 12, page 1585 et seq. (1973). Up to and including threshold in the domain where the active region charge density changes greatly, the current density is given by $$J_y(y) = \begin{cases} J_e & |y| \leq s/2 \\ J_e[1 + (|y| - s/2)/1_o]^{-2}, & |y| \geq s/2 \end{cases} \quad (2)$$

where $1_o = (0.10339/R_y J_c)^{\frac{1}{2}}$ at 300K and $J_e$ is to be determined to satisfy the threshold condition. As $J_e$ is increased above threshold, $1_o$ is assumed to be unchanged from its threshold value, so that the current flow pattern is invarient. Thus the total current is $$I_s = J_c L(s + 2\ 1_o), \quad (3)$$

where L is the laser length.

The injected current density $J_y(y)$, produces an active region charge density, n(y), which satisfies the differential equation $$\frac{d^2 n}{dy^2} - \frac{n}{L^2_D} = -\frac{J_y(y)}{eDt_2(y)} + \frac{P_{ave}\Gamma(y)g(y)|G(Y)|^2 n}{eh\nu Dt_2(y)} \quad (4)$$

where $L_D$, is the carrier diffusion length, D is the diffusion constant and e is the electronic charge.

Equation (4) differs from its counterpart in our previous analysis by the addition of the stimulated emission recombination term. That expression contains the local power gain g(y), photon energy $h\nu$, normalized modal intensity $|G(y)|$ $n^2$, the electronic charge, e, the diffusion constant, D, and the average internal cavity power $P_{ave}$. This last quantity is an approximate average over the cavity length of the summed left and right traveling waves and is related to the optical output power transmitted through a single laser mirror facet by $$P_1 = \frac{2(1 - R_1)}{\sqrt{R_1}} \frac{[(1 + R_1)\sqrt{R_2} + (1 + R_2)\sqrt{R_1} - 4\sqrt{R_1 R_2}]}{[(1 + R^2_1)R_2 + (1 + R^2_2)R_1 - 4R_1 R_2]} P_{ave} \quad (5)$$

where $R_1$ and $R_2$ are the modal power reflectivities of the laser mirror facets.

In our analysis, equation (4) is solved self-consistently with the modal field equation $$\frac{d^2 G}{dy^2} + [ik_o 2 10^{-4}\alpha_I - k_o \eta_2 \Gamma(y)g(y)10^{-4}(b + i) + \beta_x^2(y) - \beta_z^2]G = 0 \quad (6)$$

where $\eta_2$ is the refractive index of the unpumped active region, $\beta_z^2$ is the model propagation constant to be determined, $\beta^2_x(y)$ is found by solving the modal field equation in the x direction, $k_o$ is the free space wave number, $\alpha_I$ are the internal absorption and scattering power losses (cm$^{-1}$ units), g(y) is the local modal power gain, and b is the ratio of real to imaginary index change produced by charges in the active region 18. Next, we assume $$g(y) = 150[10^{-18}n(y) - 1]\text{cm}^{-1}, \quad (7)$$

and the modal gain is given by $$\alpha g = -2 \cdot 10^4 \text{Im}(\beta_z)\text{cm}^{-1}, \quad (8)$$

with $\beta_z$ in $\mu\text{m}^{-1}$. Finally, the laser must satisfy the cavity oscillation condition $$\alpha g = (\tfrac{1}{2}L)ln(1/R_1 R_2), \quad (9)$$

which in our formulation is independent of the internal losses since they are already included in equation (6).

To calculate $I_{th}$, $P_{ave}$ is set equal zero in equation (4), and the equations are solved simultaneously so as to satisfy equation (9) for the $TE_{00}$ mode. Then with n(y) known, equation (6) is used to obtain the $TE_{01}$ mode pattern and gain. Above threshold, $J_e$ is specified, thereby fixing $I_s$, and the other equations are solved self-consistently for $P_{ave}$ and $P_1$. Once again this procedure determines n(y), which now differs because of the spatial hole burning, and the new $TE_{01}$ mode gain is computed. At some current, with $TE_{00}$ power level $P_1^*$, the gain of the $TE_{01}$ mode satisfies the cavity oscillation condition of equation (9) and that mode attains threshold.

Consider as an example an injection laser 10 with the fractional aluminum compositions of $\xi_1 = 0.25$, $\xi_2 = 0.05$, $\xi_3 = 0.4$ and an active region thickness is $t_2(y) = 0.14 - 0.2[1 - \exp(-0.15\ y^2)]$. The more gradual taper weakens the internal waveguidance and the asymmetric aluminum acts to lower $\Gamma(y)$, especially away from the modal center. In addition, a shallow proton implantation, which is employed to delineate the stripe contact, has the effect of increasing the spreading resistance $R_y$. Assume $L_D = 3$ μm, $D = 30$ cm$^2$/sec, $R_1 = R_2 = 0.3$, $b = 2$, and the refractive indices are $\eta_1 = 3.466$, $\eta_1 = 3.638$, and $\eta_1 = 3.351$, at the lasing wavelength of 0.8387 μm. With $\alpha_l = 20$ cm$^{-1}$, $R_y$ increased to 5000 Ω, and L = 275 μm, the calculated results are tabulated in Table I, together with actual experimental data. Again $I_{th}$, $P_1^*$ and mode width agree quite well with the observations, but $\eta_D$ being in agreement less so. However, if $\alpha_l$ is increased to 30 cm$^{-1}$, only $\eta_D$ changes significantly. It becomes 46% for the 5 μm stripe width which virtually coincides with the measured value of 47%. Aside from supporting the accuracy of the analysis, this example indicates several important features of these lasers. The asymmetric aluminum and the very slight taper 20 in the active region greatly influence the discrimination against higher order modes and, in particular, increase the threshold, $P_1^*$, of the TE$_{01}$, mode to a great extent. Also, in particular, if s = 3 μm, laser 10 can operate single transverse mode up to 40 mwatts with $I_{th}$ approximately 40 mamps and with $\eta_D$ on the order of 50%.

Figure 2:
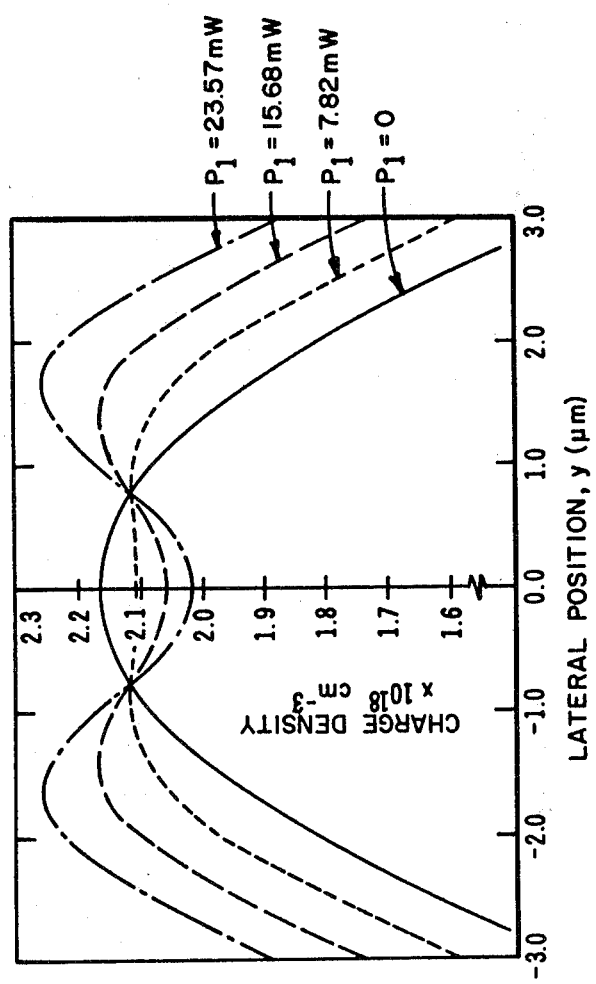
FIG. 2 is a graphic illustration of the charge density versus lateral position for the model injection laser of FIG. 1.

Other aspects of device behavior are disclosed by the foregoing calculations. In FIG. 2 are plotted charge distributions for the 4 μm stripe asymmetrical laser at output power levels $P_1 = 0$, 7.82, 15.68 and 23.57 mwatts. Spatial hole burning is evident. These power levels were computed at equal pumping current increments of 18.99 mamps. Thus the power versus current characteristic may be approximated by $P_1 = 0.4107(I - I_{th}) + 0.000,055(I - I_{th})^2$ and $\eta_D$ increases from 55.74% near threshold to 56.17% at $P_1^* = 23.7$ mwatts. This phenomenon results from the enhanced diffusion gradient at elevated power levels. Spatial hole burning also influences the mode patterns. At threshold the calculated TE$_{00}$ model power distribution is almost exactly Gaussian with 2.06 μm FWHP, but with increasing $|y|$ the modal decay is slightly slower. For practical purposes, the modal wave front is planar, at $y = 1$ μm there exists a 0.4° phase shift relative to modal center. Calculations predict TE$_{00}$ modal widths of 2.04 μm, 2.02 μm and 2.0 μm with $P_1 = 7.82$, 15.68 and 23.57 mwatts, respectively.

To better understand the importance of asymmetric compositional content in the cladding layers 22 and 24 and the effect of parametric changes of the geometry relating to LSTV and taper rapidity, $\gamma$, the illustrations of remaining figures graphically show how the lasing threshold $P_1^*$, for the TE$_{01}$ mode are greatly increased. Also shown are changes in the TE$_{00}$ mode current threshold, $I_{th}$, the quantum efficiency, $\eta_D$, and the full width half power (FWHP). The scaling on the left side of each graph is applicable for $I_{th}$ in mamps, $\eta_D$ in percentage and $P_1^*$ in mwatts. The scaling on the right side of each graph is applicable for TE$_{00}$ FWHP in microns.

Figure 3:
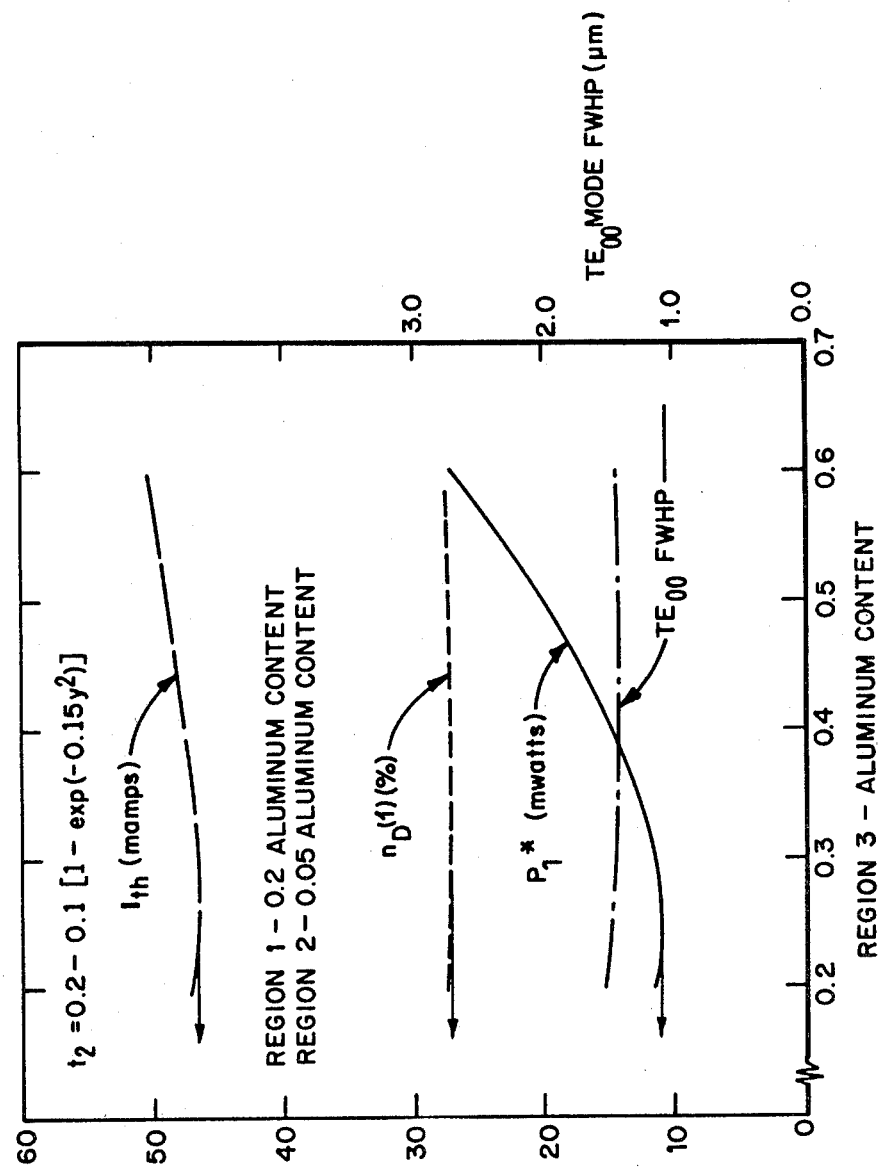
FIG. 3 is a graphic illustration of the effect on laser operating properties when varying the compositional content of one cladding layer relative to the other cladding layer.
Figure 4:
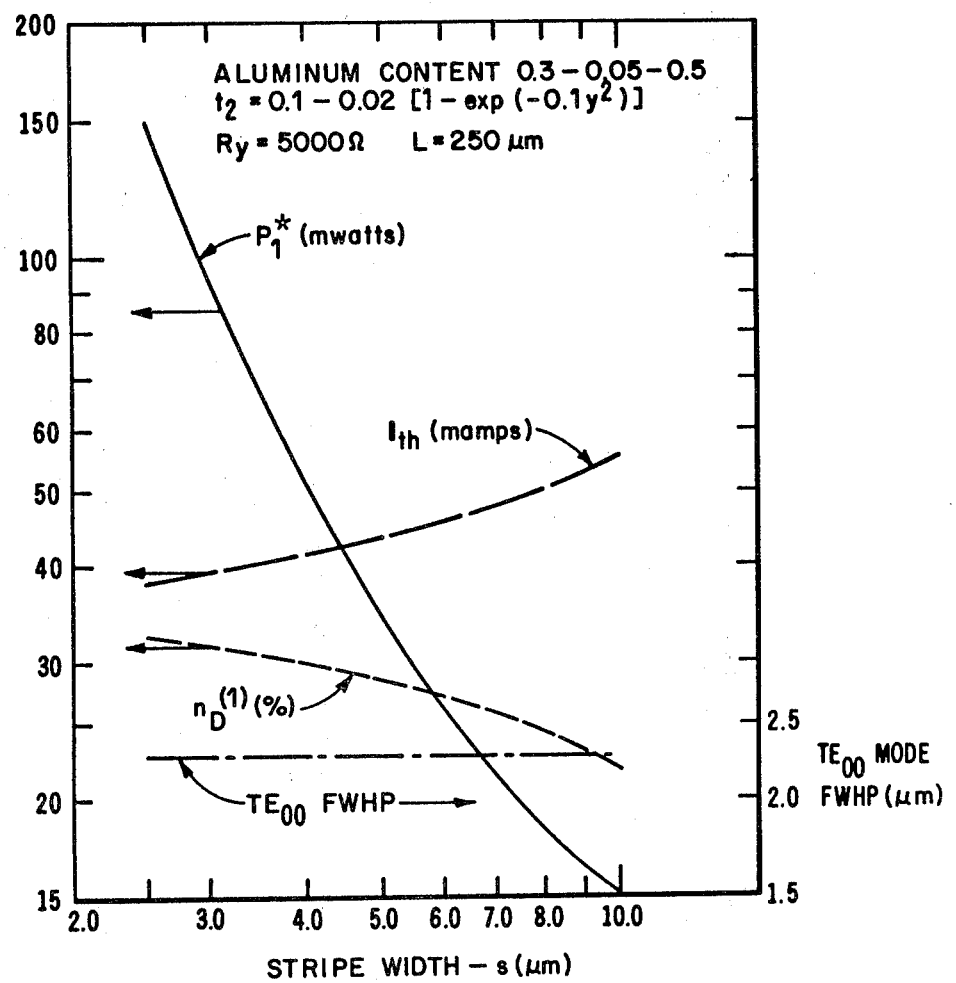
FIG. 4 is a graphic illustration of the effect on laser operating properties when varying the stripe width (current confinement) of the model injection laser having asymmetric compositional content in the cladding layers.

In FIGS. 3 and 4 asymmetric aluminum content in the cladding layers is involved while in FIGS. 5–8, the aluminum content of these two layers is made equal to 30% for the purpose of maintaining as many parameters the same while varying one other parameter as indicated along the horizontal axis of the graph. With this in mind, the increase in the TE$_{01}$ mode threshold $P_1^*$ illustrated in FIGS. 5–8 will be more enhanced if the aluminum content of the cladding layers is made asymmetric. This is supported by comparison of $P_1^*$ in FIGS. 4 and 5. The parametric variant in each illustration is stripe width. However, in FIG. 4, the aluminum content in layers 22 and 24 is asymmetric whereas in FIG. 5 the aluminum content is symmetric.

In order to more fully understand the effect of the asymmetric compositional layers 22 and 24 have on the threshold, $P_1^*$ reference is made to FIG. 3. This graphic illustration shows the effect on laser threshold, $I_{th}$, quantum efficiency $\eta_D$, TE$_{01}$ mode threshold and TE$_{00}$ full width half power (FWHP) for varying aluminum content in region 3 (layer 24) while the aluminum content in region 2 (active layer 16) is maintained at 5% and the aluminum content in region 1 is maintained at 20%. The aluminum content of region 1 could, alternatively, be varied from or increased over that for region 3.

TABLE I

Data for a laser with asymmetric Al composition of 25%-5%-40%, $R_1 = R_2 = 0.3$, $L_D = 3$ μm, $D = 30$ cm$^2$/sec, $b = 2$, $\alpha = 20$ cm$^{-1}$, $R_y = 5000 \Omega$ and L = 275 μm. The active region thickness is $0.12 + 0.02 \exp(-0.15 y^2)$ μm.

| | ANALYSIS | | | | EXPERIMENT |
|---|---|---|---|---|---|
| STRIPE WIDTH s, μm | 6 | 5 | 4 | 3 | 5 |
| Threshold Current $I_{th}$, mamps | 47.2 | 44.7 | 42.5 | 40.5 | 43 |
| Differential Quantum Efficiency $\eta_D$, % | 50 | 53 | 56 | 59 | 47 |
| Power Output For TE$_{01}$ Mode Threshold $P_1^*$ mwatts | 11.2 | 15.4 | 23.7 | 42.9 | 15 |
| Near Field Mode Size FWHP μm | 2.05 | 2.05 | 2.05 | 2.05 | 2.1 |

To be noted is the significant change in the threshold of $P_1^*$ as the aluminum content in region 3 increases.

In FIG. 4, the aluminum content for regions 1, 2 and 3 is 30%, 5% and 50%, respectively. Note that for decreasing current confinement (stripe width), there is a pronounced increase in the TE$_{01}$ mode threshold $P_1^*$.

Comparatively, changes in laser threshold, quantum efficiency and FWHP are not that significant.

Figure 5:
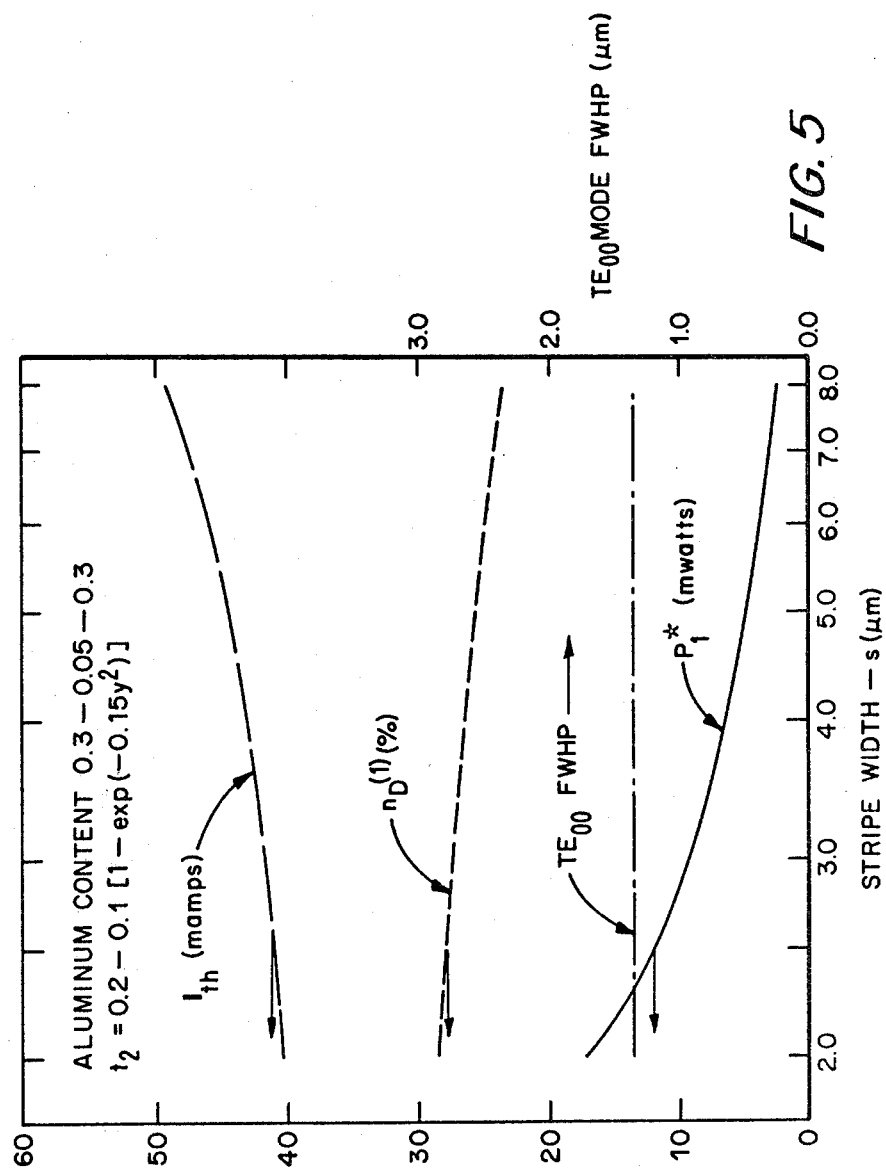
FIG. 5 is a graphic illustration, for comparative purposes of the effect on laser operating properties when varying the stripe width (current confinement) of the model injection laser having symmetric compositional content in the cladding layers.

Again, FIG. 5 illustrates these same parameters for varying current confinement with the aluminum content for regions 1, 2 and 3 is 30%, 5% and 30%, respectively. Also, the maximum thickness, $t_2(0)$, of the active region 18 is larger and the rapidity, $\gamma$, to its minimum value at $t_2(\infty)$ is higher. There is large increase in $P_1^*$ for smaller stripe widths but not as pronounced as in the case of $P_1^*$ in FIG. 4.

Figure 6:
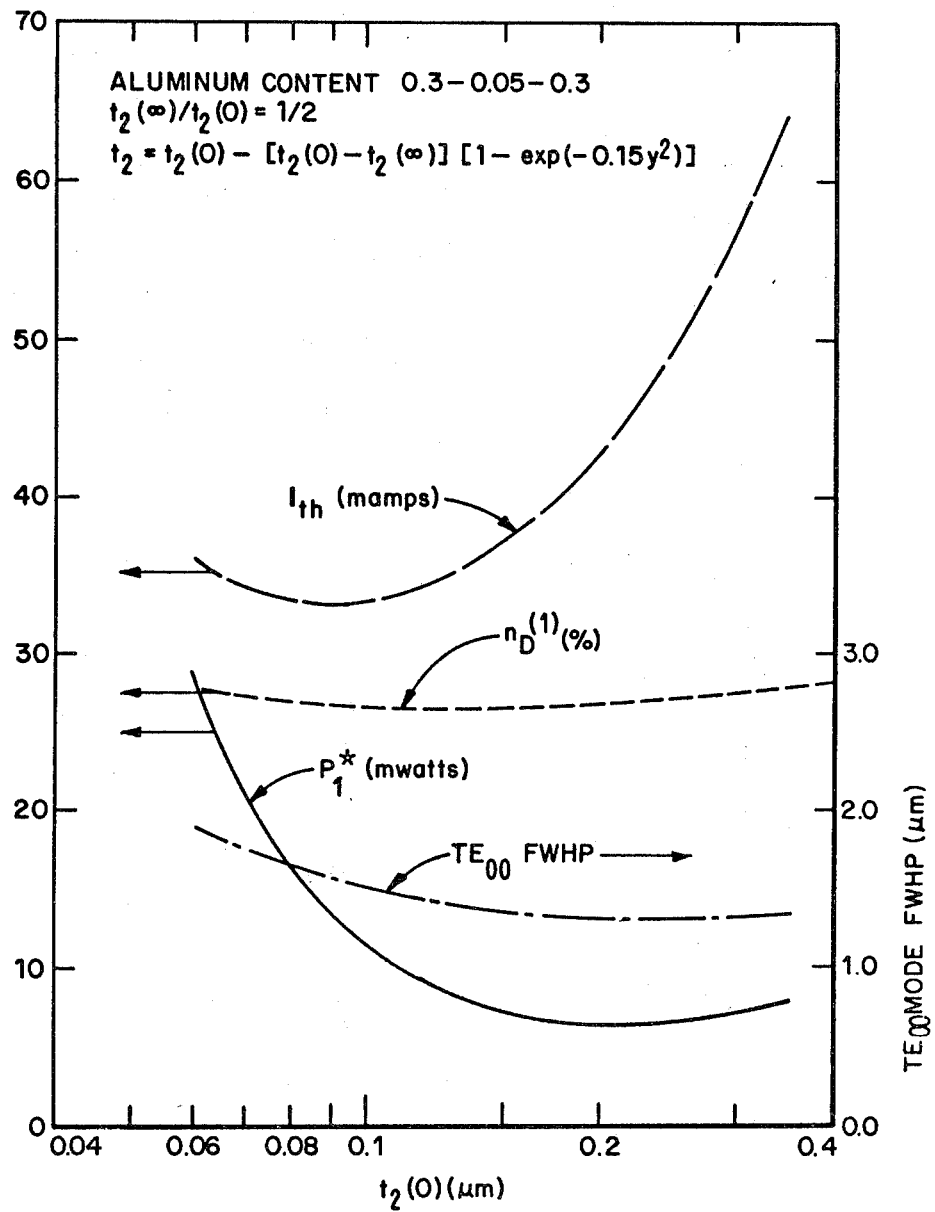
FIG. 6 is a graphic illustration of the effect on laser operating properties of the model injection laser having symmetric cladding layers for variations in active layer maximum thicknesses designated $t_2(0)$.

In FIG. 6, the parametric variant is the maximum thickness, $t_2$, of the active region 18 at $y = 0$ and with the ratio of $t_2(\infty)/t_2(0)$ equal to one half. To be noted is the increase in $P_1^*$ for smaller thicknesses $t_2(0)$ with accompanying decreases in laser TE$_{00}$ mode current threshold and increase in the TE$_{00}$ mode FWHP.

Figure 7:
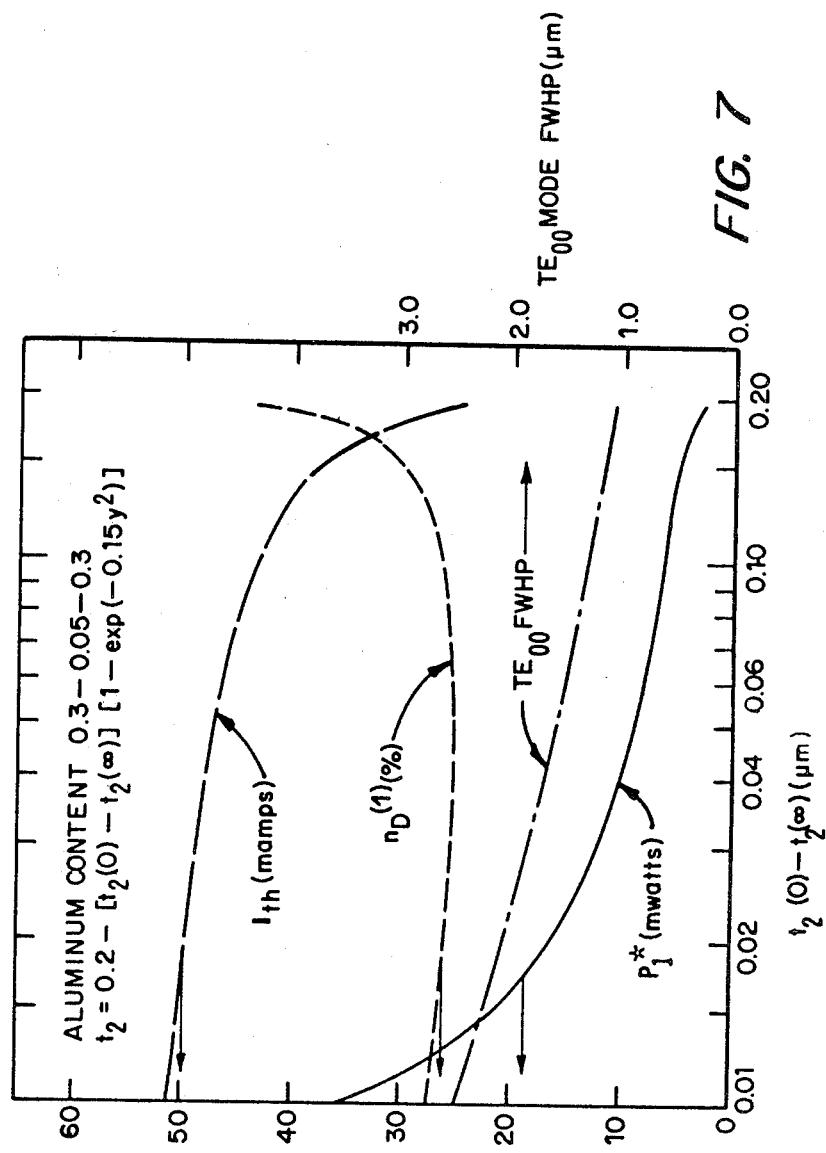
FIG. 7 is a graphic illustration of the effect on laser operating properties of the model injection laser having symmetric cladding layers for variations in the difference between the maximum and minimum thicknesses in the active layer designated as $t_2(0) - t_2(\infty)$.

In FIG. 7, the parametric variant is the difference between the maximum thickness and the minimum thickness of the active region 18, i.e., $t_2(0) - t_2(\infty)$. To be noted is that with smaller differences between these thickness values, the lasing threshold of the TE$_{01}$ mode is increased while the parameters of threshold current, quantum efficiency and FWHP do not change that significantly. Of these three parameters, the FWHP increases most significantly.

Figure 8:
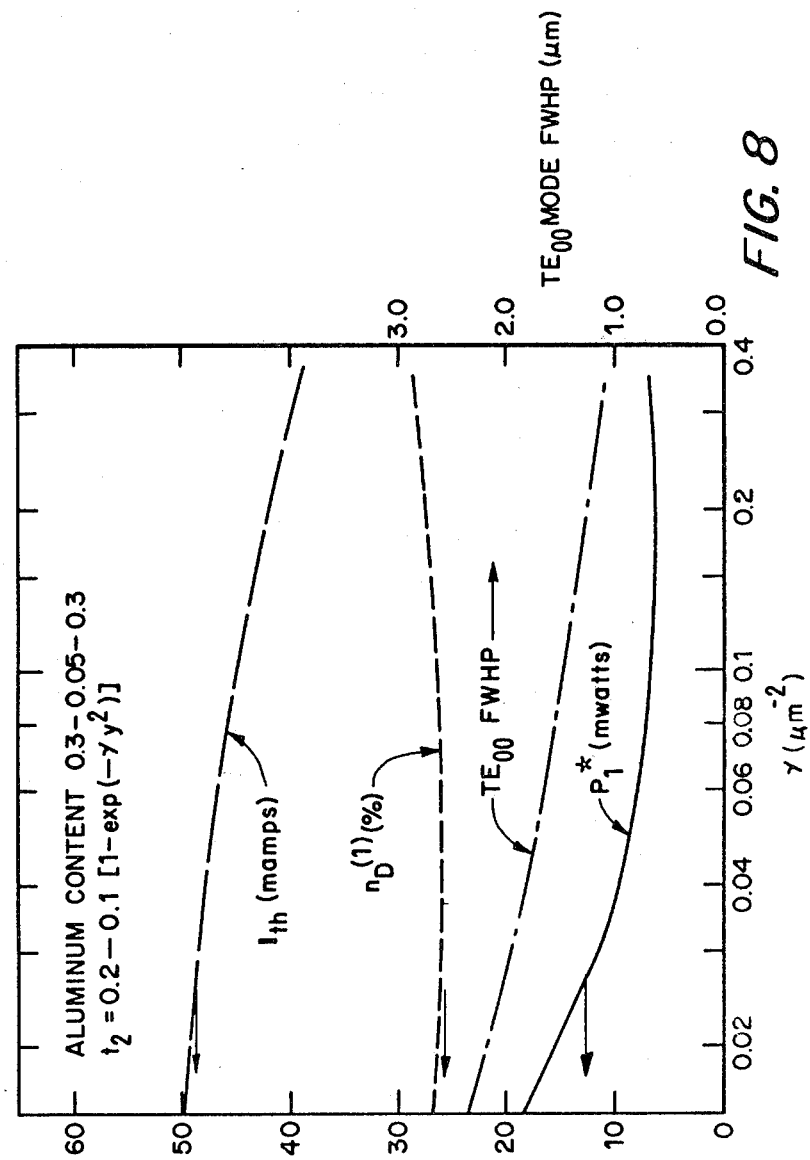
FIG. 8 is a graphic illustration of the effect on laser operating properties of the model injection laser having symmetric cladding layers for variations in the rapidity at which the active layer thickness $t_2$ decreases from its maximum thickness, $t_2(0)$ to its minimum thickness at $t_2(\infty)$.

In FIG. 8, the rapidity parameter, $\gamma$, is varied and, again, where $\gamma$ is small, i.e., where the variation of layer thickness is small for a given length, the threshold $P_1^*$ for the TE$_{01}$ mode increases significantly. The increase in FWHP is about the same as that shown in FIG. 7.

Expectedly, increases in the $TE_{01}$ mode threshold $P_1^*$ would be more significant with asymmetric aluminum content provided in cladding layers 22 and 24.

The foregoing graphic illustrations demonstrate that for small values of $t_2(0)$, $t_2(0)-t_2(\infty)$, $\gamma$, i.e., for small nonplanar active region thickness changes and slight taper variations, and with asymmetric aluminum content at present in cladding layers 22 and 24, large discriminatory effects against higher order transverse mode propagation can be obtained by raising the level at which these modes, in particular the $TE_{01}$ mode, will lase and propagate in the laser. The discriminatory effect is further enhanced by providing narrow stripe widths (narrow current confinement), s, with large spreading resistance, $R_y$.

Preferred conditions are obtained if the LSTV is governed by the ratio of the difference between maximum and minimum thicknesses relative to the maximum thickness in conjunction with the rapidity from the maximum to the minimum thickness of the active region 18 is of the range of 0.1 to 0.05 or $$.01 < \left[ \frac{t_2(0) - t_2(\infty)}{t_2(0)} \right] \gamma < .05.$$

This range of small LSTV provides for more charge injection into modal volume, i.e., toward $y-0$ causing gain enhancement for the gain of the $TE_{00}$ mode to the detriment of the gain available for the $TE_{01}$ mode. This is one factor as to why $P_1^*$ increases to high levels.

The percentage of aluminum content between layers 22 and 24 should, at best, be at least 10% and may be as high as 60%. The asymmetric content difference sufficiently effects the difference in the refractive indices of these layers to "push" modal guiding of the $TE_{00}$ mode in the negative X direction and permit the mode to spread laterally in the y direction to achieve more gain whereby less gain is contributable to the $TE_{01}$ mode.

The Gaussian representation used for $t_2(y)$ in the illustration of the preferred embodiment is for representational convenience. Any other mathematical expressions which describe a continuous thickness variation from a maximum at $y=0$ to a smaller thickness value toward $y=\infty$ would be equally suitable for describing the kind of slight taper desired for the active region 18.

While the invention has been described in conjunction with specific embodiments, it is evident that many alternatives, modifications and variations may be applicable. For example, in some material systems the doping level of cladding layers 22 and 24 may be changed rather than the aluminum content to effect a quantitative difference between their refractive indices. Also, a graded or stepped change in the refractive index can be accorded to these layers. Also, other semiconductor materials can be employed involving compounds made up of two or more elements from the group consisting of In, Ga, As, P, Sb, N, Al, Pb, Sn, Se, Te, Cd, and Zn. Accordingly, the invention as described is intended to embrace all such alternatives, modifications, and variations as fall within the spirit and scope of the appended claims.

What is claimed is:

1. In an injection laser comprising a plurality of contiguous layers of semiconductor material, one of said layers fabricated to form an active layer for optical wave propagation under lasing conditions, a cladding layer contiguous with each surface of said active layer and each having a higher bandgap and a lower refractive index than said active layer, said active layer having an active region with a lateral spatial variation in thickness extending from a central point of maximum thickness to adjacent points of minimum thickness, the improvement comprising.
   means in said cladding layers to produce a quantitative difference in their relative refractive indices and
   the lateral spatial variation of the thickness of said region governed by the ratio of the difference between said maximum and minimum thicknesses relative to said maximum thicknesses in conjunction with the rapidity from said maximum thickness to said minimum thickness being in the range of 0.01 to 0.05.

2. In the injection laser of claim 1 wherein said means comprises a compositional difference in the semiconductor material comprising said cladding layers.

3. In the injection laser of claim 2 wherein said compositional difference is the percentage of aluminum in the semiconductor material of gallium aluminum arsenide.

4. In the injection laser of claim 3 wherein said compositional difference is in the range of 10% to 60%.

5. In the injection laser of claim 1 which includes narrow current confinement means to confine a substantial portion of the current supplied to said laser to the vicinity of said active region central point.

* * * * *